(12) United States Patent
Amponsah (10) Patent No.: US 10,866,273 B2
(45) Date of Patent: Dec. 15, 2020

(54) FUNCTIONAL PROBER CHIP

(71) Applicant: Xallent, LLC, Ithaca, NY (US)

(72) Inventor: Kwame Amponsah, Ithaca, NY (US)

(73) Assignee: Xallent, LLC, Ithaca, NY (US)

(*) Notice: Subject to any disclaimer, the term of this patent is extended or adjusted under 35 U.S.C. 154(b) by 25 days.

(21) Appl. No.: 15/454,268

(22) Filed: Mar. 9, 2017

(65) Prior Publication Data

US 2017/0261544 A1   Sep. 14, 2017

Related U.S. Application Data

(60) Provisional application No. 62/305,754, filed on Mar. 9, 2016.

(51) Int. Cl.
*G01R 31/26* (2020.01)
*G01R 1/067* (2006.01)
*H01L 21/66* (2006.01)

(52) U.S. Cl.
CPC ..... *G01R 31/2639* (2013.01); *G01R 1/06755* (2013.01); *G01R 1/06761* (2013.01); *G01R 31/2644* (2013.01); *H01L 22/14* (2013.01); *H01L 22/32* (2013.01)

(58) Field of Classification Search
CPC ............ G01R 31/2639; G01R 31/2644; G01R 1/06761; G01R 1/06755; H01L 22/14; H01L 22/32
See application file for complete search history.

(56) References Cited

U.S. PATENT DOCUMENTS

| | | |
|---|---|---|
| 4,992,660 A | 2/1991 | Kobayashi |
| 5,148,103 A | 9/1992 | Pasiecznik, Jr. |
| 5,426,302 A | 6/1995 | Marchman et al. |
| 5,436,448 A | 7/1995 | Hosaka et al. |
| 5,666,190 A | 9/1997 | Quate et al. |
| 5,994,698 A | 11/1999 | Kawade et al. |
| 6,078,186 A | 6/2000 | Hembree et al. |

(Continued)

FOREIGN PATENT DOCUMENTS

| | | |
|---|---|---|
| CN | 1159001 | 9/1997 |
| CN | 1160193 | 9/1997 |

(Continued)

OTHER PUBLICATIONS

Ming-Dou Ker, et al., "Fully Process-Compatible Layout Design on Bond Pad to Improve Wire Bond Reliability in CMOS ICs", IEEE Transaction on Components and Packaging Technologies, IEEE Service Center, Piscataway, NJ, US, Vo. 25, No. 2, Jun. 1, 2002 (Jun. 1, 2002), pp. 309-316, XP011070771, ISSN: 1521-3331; figures 1-7.

(Continued)

*Primary Examiner* — Akm Zakaria
(74) *Attorney, Agent, or Firm* — Bond, Schoeneck & King, PLLC (57) ABSTRACT

Systems, devices, and methods for characterizing semiconductor devices and thin film materials. The device consists of multiple probe tips that are integrated on a single substrate. The layout of the probe tips could be designed to match specific patterns on a CMOS chip or sample. The device provides for detailed studies of transport mechanisms in thin film materials and semiconductor devices.

11 Claims, 12 Drawing Sheets

(56) References Cited

U.S. PATENT DOCUMENTS

| | | |
|---|---|---|
| 7,349,223 B2 | 3/2008 | Haemer et al. |
| 7,397,087 B2 | 7/2008 | Chinthakindi et al. |
| 7,872,482 B2 | 1/2011 | Chong et al. |
| 8,056,402 B2 | 11/2011 | Hecker et al. |
| 8,440,523 B1* | 5/2013 | Guillorn ............ B81C 1/00396 257/E21.002 |
| 8,575,954 B2 | 11/2013 | Chong et al. |
| 10,048,289 B2 | 8/2018 | Lal et al. |
| 2002/0153583 A1 | 10/2002 | Frazier et al. |
| 2003/0020500 A1 | 1/2003 | Altmann et al. |
| 2003/0189439 A1* | 10/2003 | Kohno .................... H01L 23/13 324/754.07 |
| 2004/0004182 A1 | 1/2004 | Kranz et al. |
| 2004/0157350 A1* | 8/2004 | McQuade .......... G01R 1/06744 438/14 |
| 2004/0223309 A1 | 11/2004 | Haemer et al. |
| 2005/0026476 A1* | 2/2005 | Mok ...................... C23C 18/00 439/81 |
| 2006/0027878 A1 | 2/2006 | Chinthakindi et al. |
| 2006/0257286 A1 | 11/2006 | Adams |
| 2007/0234786 A1 | 10/2007 | Moon |
| 2008/0246500 A1 | 10/2008 | Chong et al. |
| 2008/0258059 A1 | 10/2008 | Saito et al. |
| 2009/0001488 A1* | 1/2009 | Magana ................. B82Y 35/00 257/428 |
| 2009/0114000 A1 | 5/2009 | Hecker et al. |
| 2010/0071098 A1 | 3/2010 | Mirkin et al. |
| 2010/0115671 A1 | 5/2010 | Pryadkin et al. |
| 2010/0154085 A1 | 6/2010 | Maruyama et al. |
| 2010/0205698 A1 | 8/2010 | Faucher et al. |
| 2010/0229265 A1* | 9/2010 | Jin ......................... B82Y 15/00 850/60 |
| 2010/0244867 A1* | 9/2010 | Chong .................... G01R 3/00 324/755.05 |
| 2010/0257643 A1 | 10/2010 | Reifenberger et al. |
| 2010/0263098 A1 | 10/2010 | Müller et al. |
| 2011/0055982 A1 | 3/2011 | Watanabe et al. |
| 2011/0089572 A1* | 4/2011 | Tezcan ............. H01L 21/76898 257/774 |
| 2011/0126329 A1 | 5/2011 | Despont et al. |
| 2013/0249584 A1 | 9/2013 | Lou et al. |
| 2014/0331367 A1 | 11/2014 | Lal et al. |
| 2016/0252545 A1 | 9/2016 | Amponsah |
| 2016/0252546 A1 | 9/2016 | Amponsah |
| 2017/0213792 A1* | 7/2017 | Nag .................. H01L 21/76805 |
| 2018/0149673 A1* | 5/2018 | Huo ...................... G01Q 20/02 |

FOREIGN PATENT DOCUMENTS

| | | |
|---|---|---|
| CN | 2465175 | 12/2001 |
| CN | 2488061 | 4/2002 |
| CN | 1416523 | 5/2003 |
| CN | 101920338 | 12/2010 |
| CN | 103235158 | 8/2013 |
| CN | 104087505 | 10/2014 |
| CN | 104105655 | 10/2014 |
| EP | 1085327 | 3/2001 |
| JP | H07120482 | 5/1995 |
| JP | 2005507175 | 3/2005 |
| JP | 2005300177 | 10/2005 |
| JP | 2010526284 | 7/2010 |
| JP | 4685309 | 5/2011 |
| KR | 20090128186 | 12/2009 |
| WO | 0120347 | 3/2001 |
| WO | 03019238 | 3/2003 |
| WO | 2011159351 | 12/2011 |
| WO | 2013090887 | 6/2013 |
| WO | 2014041677 | 3/2014 |
| WO | 2014114860 | 7/2014 |

OTHER PUBLICATIONS

Koester, S. J. et al. "Wafer-level 3D integration technology", IBM Journal of Research and Development, International Business Machines Corporation, New York, NY, US, vol. 52, No. 6, Nov. 1, 20008 (Nov. 1, 2008), XP002676160, ISSN: 0018-8646, DOI: 10.1147/JRD.2008.5388565, pp. 583-597.

Song, Z.G. et al., "Front-end processing defect localization by contact-level passive voltage contrast technique and root cause analysis", Physical and Failure Analysis of Integrated Circuits, 2002, IPFA 2002, proceedings of the 9th International Symposium on the Jul. 8-12, 2002, Piscataway, NJ, USA, IEEE, Jul. 8, 2002 (Jul. 8, 2002), XP010597768, ISBM: 978-0-7803-7416-4, pp. 97-100.

PCT Search PCT/ISA/206 Form; EPO Form 1707 04.17; PCT/US2017/021538; dated Jun. 14, 2017 (Jun. 14, 2017); 17 pages.

Yoomin, Ahn et al. "Si multiprobes integrated with lateral actuators for independent scanning probe applications; AFM Si multiprobes with lateral actuators" Journal of Micromechanics & Microengineering, Institute of Physics Publishing, Bristol, GB, vol. 15, No. 6, Jun. 1, 2005, pp. 1224-1229; doi: 10.1088/0960-1317/15//6/012.

* cited by examiner

FUNCTIONAL PROBER CHIP

FIELD OF THE INVENTION

The present disclosure is directed generally to prober chips for semiconductor device and thin film material testing and characterization.

BACKGROUND

Complementary metal-oxide-semiconductor (CMOS) circuits consist of various functional blocks such as SRAM cells, DRAM cells, and memory cells, among many others. Transistors form the basis of these functional blocks, and one or more faults in a transistor can render parts of an integrated circuit (IC), or even entire IC chips, useless. Accordingly, the ability to identify faults during the early stages of IC fabrication can save semiconductor companies millions of dollars every year, and can accelerate the time-to-market of new technologies.

Figure 1:
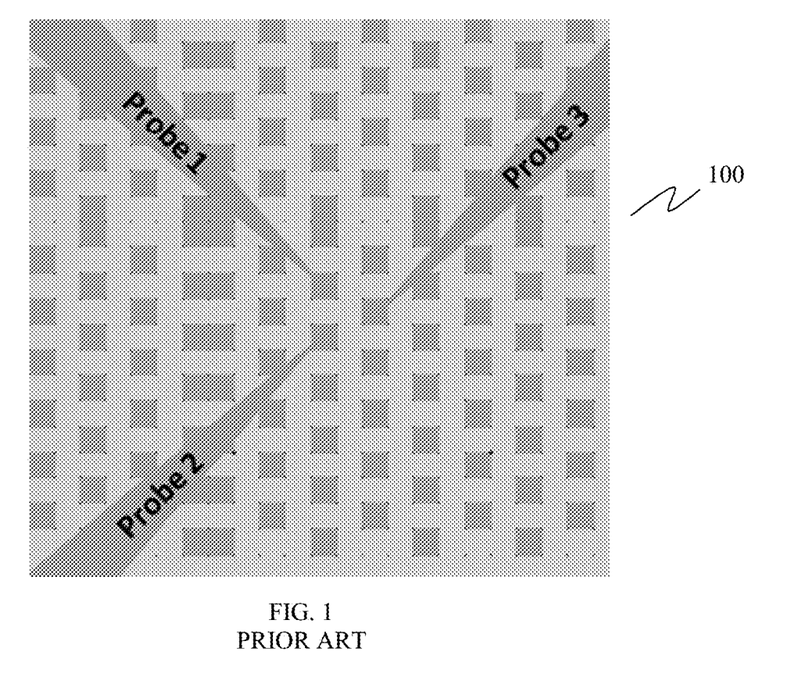
FIG. 1 is an image of independent probes used in nanoprobing.

Precision probes/tips are required to make contact with transistors in order to perform electrical characterization. At the nanoscale, navigation of the individual tips becomes incredibly difficult; positioning is often restricted by limited access to test features, drift can throw positioned tips off alignment before the test is complete, and multiple probe tips (as shown in FIG. 1) moving within nanometers of each other can crash into each other or the sample and cause damage.

Several OEMs have coupled independent scanning probe microscopes (SPM) to enable imaging and electrical characterization by translating multiple probes onto features of interest. Individual SPMs are complex platforms, based on supporting each tip with a stack of capabilities, lasers for alignment and sensing, nano-positioners for actuation, and electronics to improve quality and strength of the signal. By coupling multiple SPMs, the composite system is a complex, prohibitively expensive platform that is difficult to operate. In addition, lasers used to track the tips can energetically excite the sample, obscuring test results. Complicating the issue further is the fact that at the nanoscale, navigation of the individual tips becomes much more difficult. At least six probe tips are required to perform functional testing of SRAMs or DRAMs, and tips moving within nanometers of each other can crash into each other or the sample causing damage.

Figure 2:
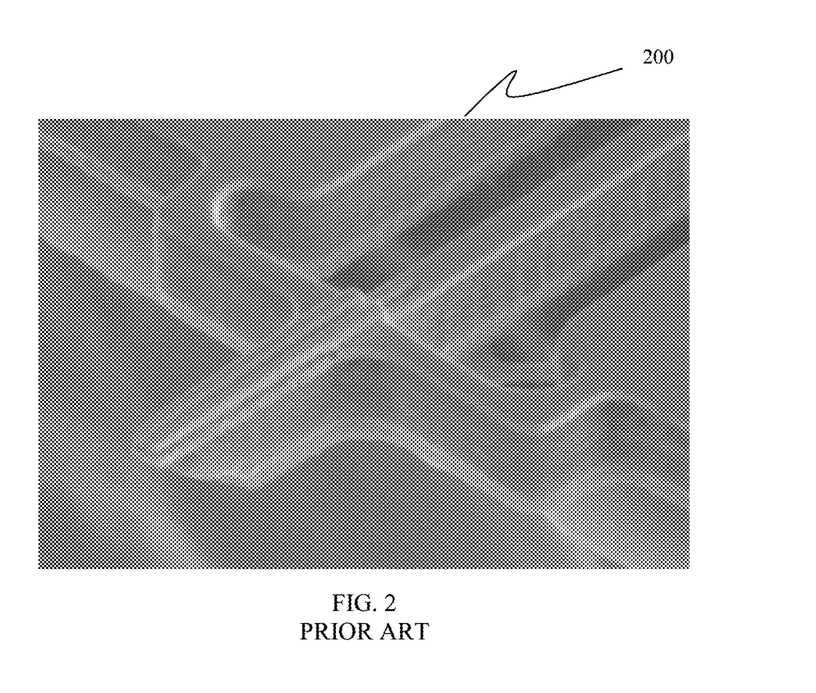
FIG. 2 is an image of a multiple integrated tips probe.

In contrast to current SPM systems with multiple stacks, there is an alternative technology known as the Multiple Integrated Tips (MiT) technology which is based on building one or multiple tips along with supporting sensing components, actuation components, and electronics onto a single prober chip. Such "probe platforms-on-a-chip" are designed and fabricated using advanced NanoElectroMechanicalSystems (NEMS) technologies, enabling simple miniaturization to the nanoscale. An example of MiT technology is shown in FIG. 2. Use of MiT technology is equally simple, and requires a single nano-positioner to navigate the chip to the feature of interest. However, this technology is limited to characterizing individual devices such as transistors in a serial manner and not designed for functional testing of circuits.

Accordingly, there is a continued need in the art for cost-effective, easily manufactured and functionalized prober chips for semiconductor device and thin film material testing and characterization.

SUMMARY OF THE INVENTION

The present disclosure is directed generally to prober chips for semiconductor device and thin film material characterization. The prober chips are realized from standard CMOS IC chips or by using advanced NEMS processing to realize the functional probers. According to an embodiment, the prober chips described or otherwise envisioned herein allow for parallel characterization of multiple devices and circuits instantaneously. The technology is based on using an IC chip (functional prober chip) to characterize another IC chip (sample). If both IC chips have the same contact point layouts, then by aligning and contacting the chips together, multiple devices or circuits on the sample IC chip could be simultaneously characterized without the need to move the prober chip from one device or circuit to the other. This form of characterization drastically reduces measurement cycle times, mitigates the crashing of probe tips into each other and addresses accessibility challenges.

According to an aspect is a CMOS prober chip. The CMOS prober chip includes: a plurality of probe tips; a plurality of interlayer metals; a plurality of interlayer dielectrics; and a plurality of bonding pads; where the plurality of interlayer metals are in conductive communication with the plurality of probe tips, and are further in conductive communication with one of the plurality of bonding pads.

According to an embodiment, each of the plurality of probe tips comprises an apex at the end of that probe tip, and wherein the probe tips comprise a conductive material. According to an embodiment, the conductive material is a cushion-like material configured to reversibly deform when pushed against a sample According to an embodiment, the conductive material comprises a thin film material selected from the group consisting of graphene and molybdenum disulphide. According to an embodiment, the conductive material comprises a metal or metal-alloy.

According to an embodiment, each of the plurality of probe tips comprises a metal contact plug. According to an embodiment, the metal contact plug comprises tungsten, platinum, gold, cobalt, nickel, an alloy, and/or silicide.

According to an embodiment, at least one of the plurality of probe tips is freely suspended along at least a portion of its length. According to an embodiment, at least one of the plurality of probe tips is spring-loaded.

According to an aspect is a method for manufacturing a CMOS prober chip. The method includes the steps of: providing a CMOS chip comprising back-end-of-line components and a plurality of metal contact plugs; and delayering a portion of the CMOS chip, the delayered portion of the CMOS chip comprising the front-end-of-line components but not including the metal contact plugs.

According to an embodiment, the step of delayering comprises chemical mechanical polishing, reactive ion etching, deep reactive ion etching, ion milling, wet chemical etching, and/or a combination thereof.

According to an embodiment, each of the metal contact plugs is configured to operate as a probe tip.

According to an embodiment, the method further includes the step of recessing an interlayer dielectric around the plurality of metal contact plugs. According to an embodiment, the step of recessing an interlayer dielectric around the plurality of metal contact plugs comprises wet chemical etching, reactive ion etching, deep reactive ion etching and/or a combination thereof.

According to an aspect is a method for manufacturing a CMOS prober chip. The method includes the step of selectively depositing a conductive material at an apex of each of the plurality of probe tips of the CMOS prober chip.

According to an embodiment, the step of selectively depositing a conductive material comprises electroplating, evaporation, sputtering, plasma enhanced chemical vapor deposition, and/or atomic layer deposition.

According to an aspect is a prober chip. The prober chip includes: a plurality of probe tips; a plurality of interlayer metals; a plurality of interlayer dielectrics; a plurality of through-substrate-vias; a plurality of bonding pads; and a substrate; where the plurality of interlayer metals are in conductive communication with the plurality of probe tips, and are further in conductive communication with the plurality of bonding pads.

According to an embodiment, at least some of the plurality of probe tips are freely suspended along at least a portion of their length.

According to an embodiment, each of the plurality of through-substrate-vias is filled with a conductive material configured to conductively connect the bonding pads to the interlayer metal layers.

According to an embodiment, the substrate comprises silicon, silicon carbide, germanium, glass, pyrex, fused silica and/or quartz.

According to an embodiment, the chip further comprises an etched through-hole configured to allow for simultaneous viewing of the plurality of probe tips and a sample.

According to an aspect is a prober chip. The prober chip includes: a set of probe tips; a set of probe electrodes; a set of interlayer dielectrics; and a substrate comprising a through-hole configured to allow for viewing of the plurality of probe tips.

According to an embodiment, at least some of the plurality of probe tips are freely suspended along at least a portion of their length According to an embodiment, the substrate comprises silicon, silicon carbide, germanium, glass, pyrex, fused silica, and/or quartz.

According to an aspect is a method for aligning a prober chip to a sample. The method includes the steps of: (i) placing a prober chip comprising at least one conductive alignment mark above or below a sample comprising at least one conductive alignment mark; (ii) contacting the at least one conductive alignment mark of the prober chip to the at least one conductive alignment mark of the sample; (iii) applying a potential difference between the at least one alignment mark of the prober chip and the at least one alignment mark of the sample; and (iv) moving at least one of the prober chip and the sample until current flows between the at least one alignment mark of the prober chip and the at least one alignment mark of the sample.

According to an aspect is a method for aligning a prober chip to a sample. The method includes the steps of: (i) placing a prober chip comprising at least one etched alignment mark above or below a sample comprising at least one alignment mark; (ii) using a microscope to view the at least one alignment mark of the sample through the at least one etched alignment mark of the prober chip; and (iii) moving at least one of the prober chip and the sample until the at least one etched alignment mark of the prober chip is aligned to the at least one alignment mark of the sample.

According to an aspect is a method for aligning a prober chip to a sample. The method includes the steps of: (i) placing a prober chip comprising at least one alignment mark with a plurality of edges above or below a sample comprising at least one alignment mark with a plurality of edges; (ii) scanning, using an infrared laser, the at least one alignment mark of the prober chip and the at least one alignment mark of the sample; and (iii) moving at least one of the prober chip and the sample until the edges of the at least one alignment mark of the prober chip are aligned with the edges of the at least one alignment mark of the sample.

These and other aspects of the invention will be apparent from the embodiments described below.

BRIEF DESCRIPTION OF THE DRAWINGS

The present invention will be more fully understood and appreciated by reading the following Detailed Description in conjunction with the accompanying drawings, in which.

DETAILED DESCRIPTION OF EMBODIMENTS

The present disclosure describes various embodiments of functional prober chips for the characterization of thin films and devices. The functional prober chip enables nanoscale electrical probing of trans-conductance, in both ambient air and vacuum environments. The device provides for detailed studies of transport mechanisms in thin film materials and devices.

Figure 3:
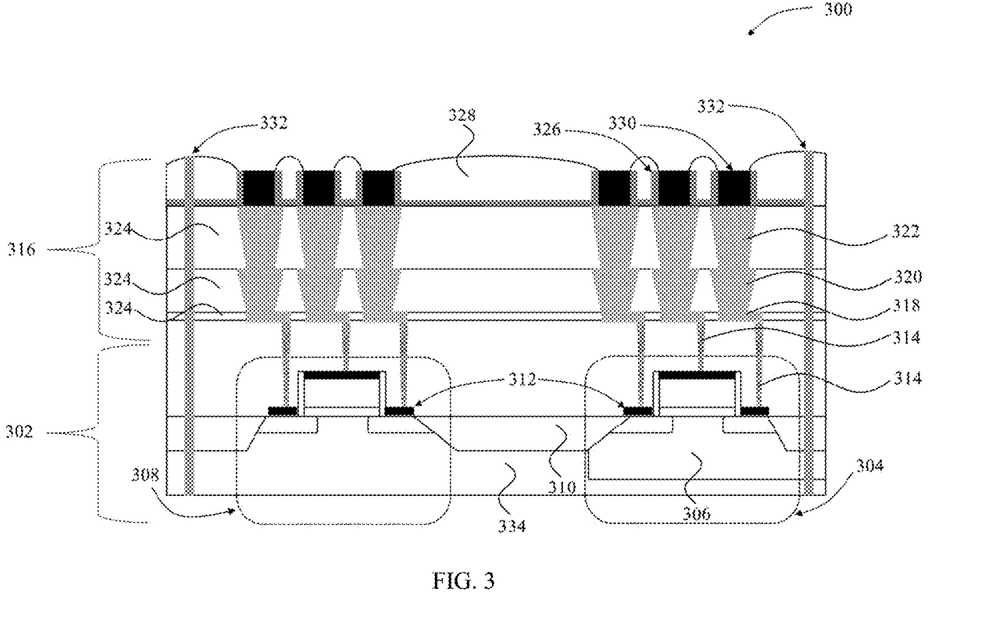
FIG. 3 is a cross sectional schematic of a standard CMOS IC chip, in accordance with an embodiment.

Referring to FIG. 3, in one embodiment, a CMOS IC chip 300 is provided. According to an embodiment, the CMOS IC chip is fabricated on a silicon substrate 334 where the Front-End-of-Line (FEOL) 302 components consist of PMOS transistor 304 with N-well 306, NMOS transistor 308, isolation 310, silicide contacts 312, contact plugs 314. According to an embodiment, the contact plugs 314 are usually made of tungsten. The Back-End-of-Line (BEOL) 316 consists of various metal interconnects 318, 320, 322, interlayer dielectrics 324, thin film passivation layers 326, polymer passivation layers 328 and bonding pads 330. Alignment marks 332 can also be patterned or etched into the IC chip 300. During or after the fabrication of an IC chip, if there is an electrical fault in the FEOL (e.g., transistors), then the chip 300 has to be delayered to the tungsten plugs 314 and nanoprobed with conventional single probes 100 or integrated probes 200.

Figure 4:
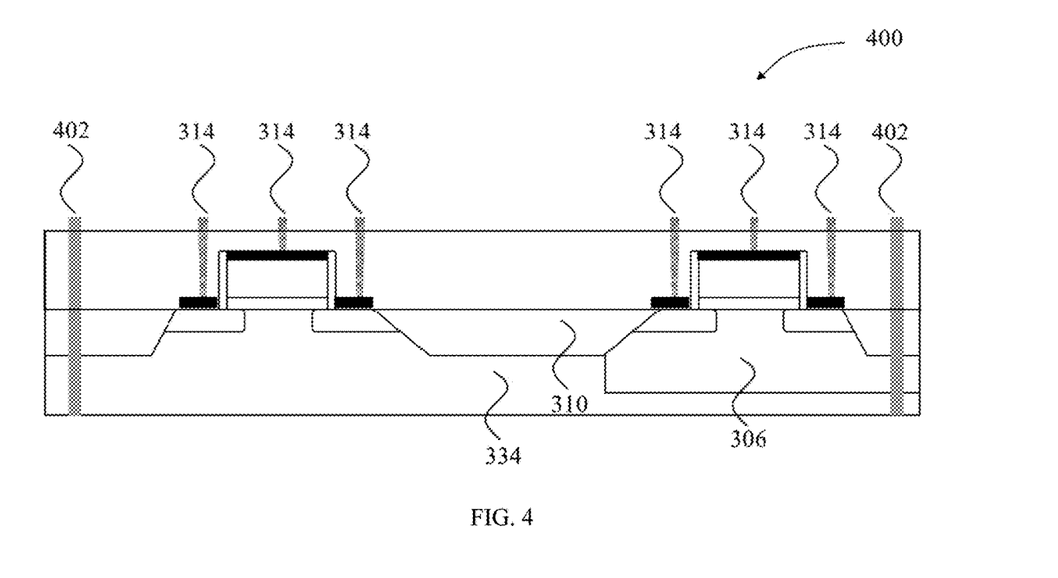
FIG. 4 is a schematic representation of the Front-End-of-Line components of a standard CMOS chip.

Referring to FIG. 4 is a schematic of a delayered sample IC chip 400. If the fault is in an SRAM or DRAM circuit, then functional testing is typically carried out using traditional methods where at least six probes are required to characterize the circuit. Navigating and landing all these probes is an arduous process. However, according to an embodiment, the methods and systems described herein utilize a CMOS prober chip with the same contact point (probe tips) layout as the sample IC chip.

Figure 5:
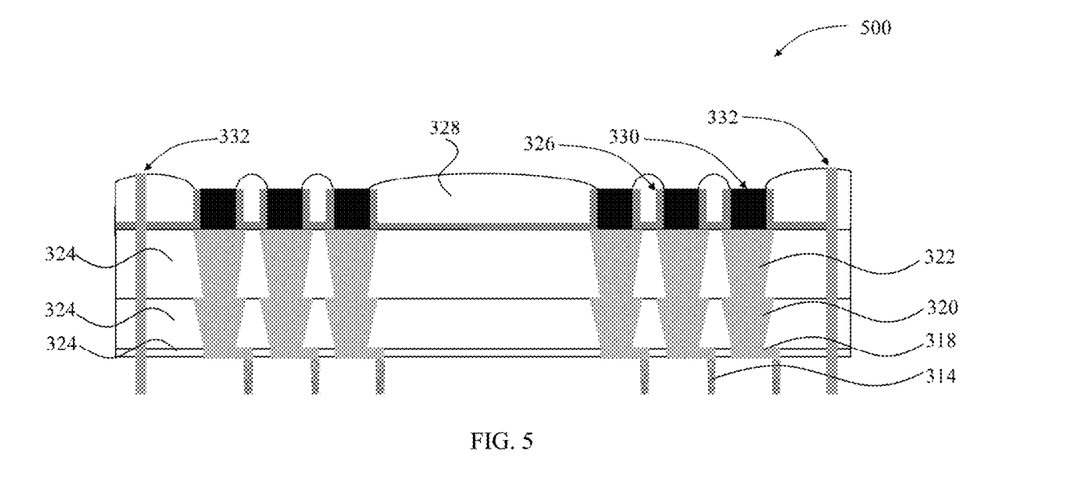
FIG. 5 is a schematic representation of a CMOS prober chip, in accordance with an embodiment.

Referring to FIG. 5, in one embodiment, is an image of a CMOS prober chip 500 specifically designed to probe the sample IC chip 400. According to an embodiment, the CMOS prober chip 500 comprises a plurality of contact plugs 314, typically comprising tungsten although many other compounds are possible. CMOS prober chip 500 further comprises a plurality of interconnects 318, 320, and 322, interlayer dielectrics 324, thin film passivation layers 326, polymer passivation layers 328, and bonding pads 330. According to an embodiment, alignment marks 332 can also be patterned or etched into the CMOS prober chip 500. According to an embodiment, both the prober chip and sample chip can come from the same wafer, wafer manufacturing lot, and/or batch. Alternatively, the chips can be fabricated independently.

According to an embodiment, given two identical IC chips 300 from the same wafer, the BEOL components of the first chip can be delayered to realize the sample IC chip 400. Delayering involves using various polishing/etching techniques such as Chemical Mechanical Polishing (CMP), Deed Reactive Ion Etching (DRIE), ion milling or wet etching to remove metals, dielectrics, polymers etc. Similarly, by delayering the FEOL components of the second IC chip 300, the CMOS prober chip 500 is realized. Thus, the CMOS prober chip 500 is complementary to the sample IC chip 400.

Figure 6:
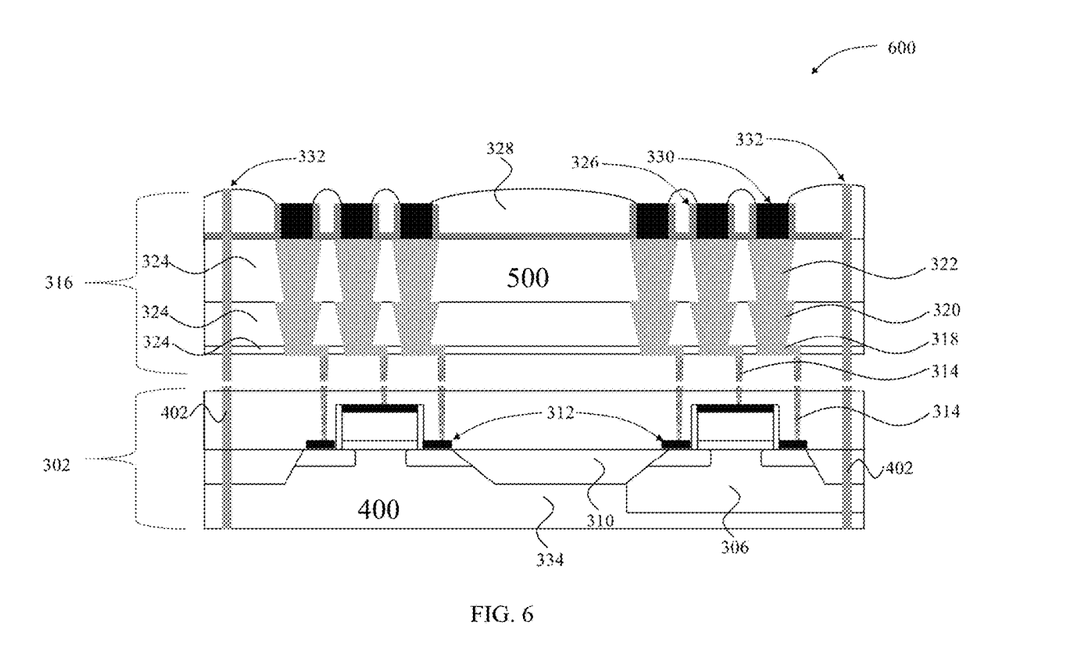
FIG. 6 is a schematic representation of the alignment of CMOS prober chip to a sample IC chip, in accordance with an embodiment.

According to an embodiment, a single CMOS prober chip 500 can be aligned and used to characterize numerous complementary sample IC chips 400 as demonstrated in FIG. 6. Referring to FIG. 6 is a CMOS prober chip 500 aligned with a complementary sample IC chip 400. The contact plugs 314 of the CMOS prober chip 500 align with the contact plugs 314 of the IC chips. After aligning and contacting the CMOS prober 500 to the sample chip 400, both device and functional testing can simultaneously be done without the need of moving the prober chip from device to device thus exponentially increasing measurement throughput.

According to an embodiment, to characterize a sample IC chip 400, electrical signals/instructions are sent from the top metal bonding pads 330 of the CMOS prober chip 500 to the tungsten probe tips 314. Understandably, some of the signal paths to the probe tips might be faulty due to a host of reasons not limited to opens in interlayer metal, non-contact of a via to a metal line, etc. To check the integrity of the probes, the CMOS prober chip is horizontally aligned with respect to a gold calibration substrate. The prober and calibration substrate are brought into contact and I-V measurements between probe tips and through the bulk of the biased gold sample can predict the integrity of the probe tips. All faulty probe tips are identified and documented.

According to an embodiment, the use of the CMOS prober chip 500 is not limited to testing delayered chips, but can also be used inline to monitor device and circuit performance during manufacturing of the FEOL components of a CMOS IC chip, among many other uses.

According to an embodiment, any CMOS chip from any semiconductor foundry or company can be post-processed or delayered to realize the CMOS prober chip as described in the embodiment.

Figure 7:
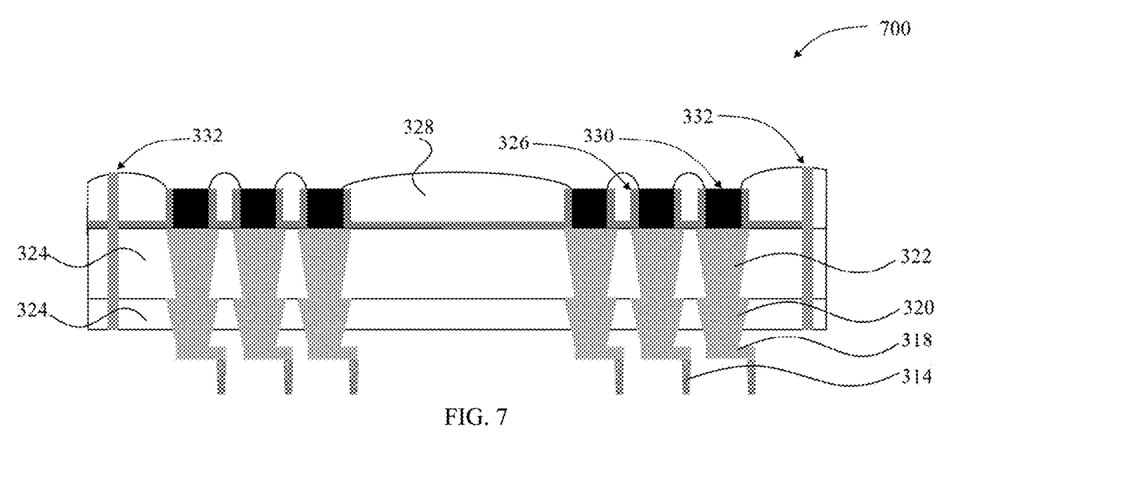
FIG. 7 is a schematic representation of a CMOS prober chip, in accordance with an embodiment.

Referring to FIG. 7, in an embodiment, is a CMOS prober chip 700. In this embodiment, the probe tips 314 of the functional prober chip are optionally spring loaded by etching the dielectric layer 324 surrounding the probe tips 314 of the chip.

Figure 8:
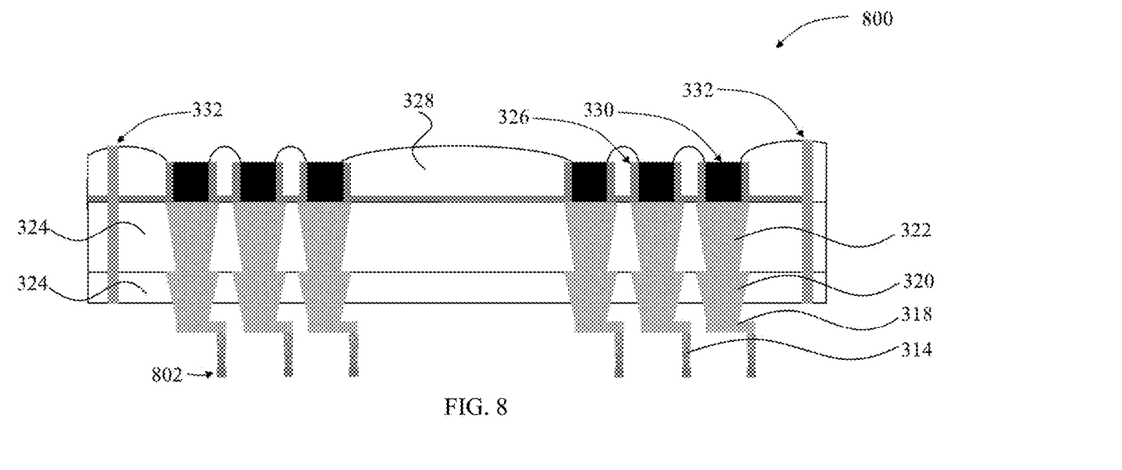
FIG. 8 is a schematic representation of a CMOS prober chip, in accordance with an embodiment.

Referring to FIG. 8, in one embodiment, is a CMOS prober chip 800. In this embodiment, conductive material 802 is selectively deposited at the apex of the probe tips 314. According to an embodiment, the conductive material 802 is also deposited on the probe tips 314 of prober chip 500. In the case of prober chip 500, the conductive material could exhibit a cushion-like behavior by reversibly deforming when pushed against a sample. According to an embodiment, by using standard lithography processing steps, an opening could be made in the photoresist at the apex of the probe tips 314 where the conductive material 802 could be deposited. Various deposition techniques such as evaporation, sputtering, atomic layer deposition, electroplating, plasma enhanced chemical vapor deposition, etc., could be used to deposit the conductive material 802.

Figure 9:
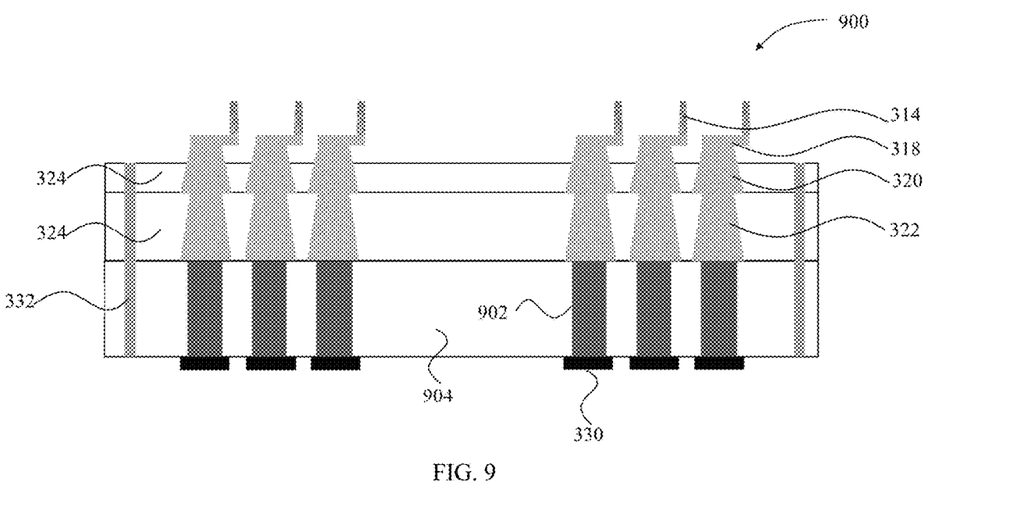
FIG. 9 is a schematic representation of a CMOS prober chip, in accordance with an embodiment.

A functional prober chip can also be realized by fabricating only the BEOL components including the probe tips 314 on a substrate 904, as shown in FIG. 9. The substrate could be silicon, silicon carbide, glass, pyrex, and/or fused silica, among many other options. Standard lithography steps including photoresist patterning, semiconductor, dielectric and metal deposition, etching, and conductive material deposition are implemented to realize the functional prober. FIG. 9 shows a functional prober where through-substrate-vias filled with conductive material 902 connect the bonding pads 330 to the interlayer metals 322.

Alignment of Functional Prober Chip to Sample IC Chip

According to an embodiment, the CMOS prober chip 500 is aligned with and used to characterize a complementary sample IC chip 400. This requires the proper alignment of the two components for accurate assessment of the IC chip. Described below are multiple embodiments of methods for aligning a CMOS prober chip 500 and an IC chip 400, including: (1) through-chip alignment; (2) optical alignment; and (3) infrared light interferometry.

1. Through-Chip-Alignment

Referring to FIG. 6, in one embodiment, is a CMOS prober chip 500 and a complementary sample IC chip 400. According to an embodiment, during manufacture, the alignment marks 332 are etched from the top side of the chip through the wafer to the bottom side of the wafer. The conductive holes created by etching the alignment marks 332 are formed in both the CMOS prober chip 500 and sample IC chip 400. The holes created by etching the alignment marks 332 are each filled with a conductive material such as a metal and/or conductive polymer, among other compounds.

Next, alignment of the CMOS prober chip 500 and sample IC chip 400 is tested using the filled conductive mark(s) 332 of the prober chip and the filled conductive mark(s) of the IC chip 400. During alignment, voltage signals are applied to the alignment marks of the CMOS prober while the alignment marks of the sample IC chip 400 are grounded. Alignment is achieved when current flows from the alignment mark 332 of the prober chip to the alignment mark 402 of the sample IC chip 400.

If the CMOS prober chip 500 and sample IC chip 400 are not properly aligned, the prober chip and/or the sample can be rotated, translated, or otherwise moved or adjusted in order to achieve alignment. The system 600 can then be tested again for alignment.

2. Optical Alignment

The CMOS prober chip 500 and sample IC chip 400 can also and/or alternatively be aligned using an optical alignment method. According to this method, the CMOS prober chip 500 comprises one or more alignment marks 332 that are etched through the prober chip, but the sample IC chip only has a patterned alignment mark on its top side. This patterned alignment mark could comprise metal or a variety of other compounds.

To align the CMOS prober chip 500 and sample IC chip 400, the prober's alignment mark(s) 332 (which may or may not be filled with a conductive material as described herein) and the IC chip's patterned alignment mark(s) are optically scanned to determine whether the two chips are aligned.

If the CMOS prober chip 500 and sample IC chip 400 are not properly aligned, the prober chip and/or the sample can be rotated, translated, or otherwise moved or adjusted in order to achieve alignment. The system 600 can then be tested again for alignment.

3. Infrared Light Interferometry

The CMOS prober chip 500 and sample IC chip 400 can also and/or alternatively be aligned using an infrared light interferometry method. According to an embodiment, metal alignment marks are patterned on the top sides of both the CMOS prober chip 500 and the sample IC chip 400. To align the chips, an infrared light is incident on the alignment marks on the CMOS prober. Since an infrared laser is transparent to silicon and silicon dioxide, the laser will reflect off the top metal marks but penetrate through the surrounding interlayer dielectrics, assuming there are no interlayer metals in the beams path to the alignment marks on the sample IC chip. Machine learning, image recognition, and edge detection algorithms are applied to the IR acquired image of the alignment marks.

If the CMOS prober chip 500 and sample IC chip 400 are not properly aligned, the prober chip and/or the sample can be rotated, translated, or otherwise moved or adjusted in order to achieve alignment. The system 600 can then be tested again for alignment.

Functional Transparent Prober Chip

According to an embodiment, arrays of multiple probe tips can be fabricated on a transparent substrate. According to an embodiment, the probe tips layout can be designed specifically for a particular CMOS chip or sample. Various probe layout configurations can be implemented on the transparent substrate. For example, layouts for transistors and SRAM functional testing can be designed and fabricated.

The transparent substrate makes it easy to visually align the prober chip to a sample using optical or electron beam microscope. Transparent wafers comprising materials such as glass, pyrex, quartz, and/or fused silica, among other compounds, can be used. It should be noted that the standard CMOS fabrication steps used to manufacture IC chip 300 could be implemented on a transparent substrate to realize a functional prober.

Figure 10:
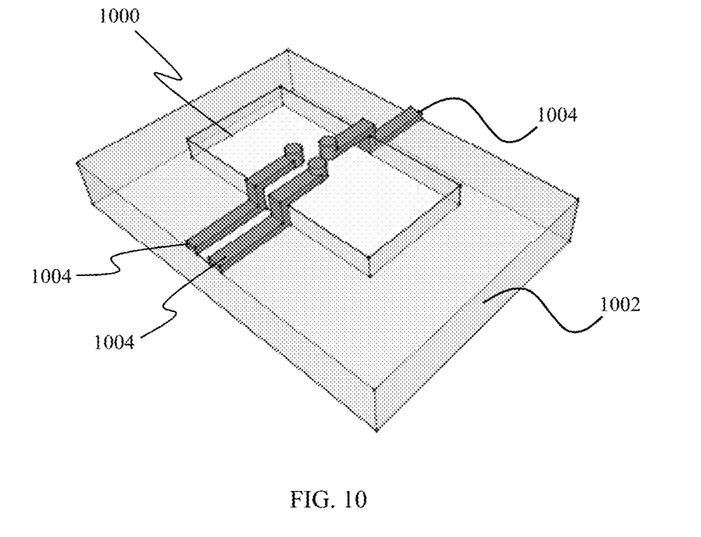
FIG. 10 is a schematic representation of probes fabricated on a transparent substrate, in accordance with an embodiment.
Figure 11:
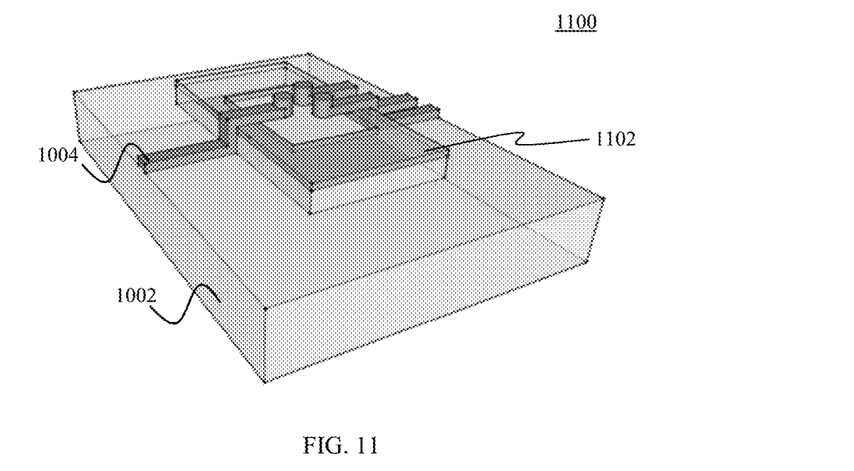
FIG. 11 is a schematic representation of spring-loaded probes fabricated on a transparent substrate, in accordance with an embodiment.

Referring to FIG. 10, in one embodiment, is a schematic representation of a functional prober chip 1000 on transparent substrate 1002. The probe electrodes 1004 could be fixed to the transparent substrate 1002 while the probe tips are spring-loaded as shown in FIG. 11 by etching away a window of sacrificial layer 1102. The sacrificial layer is sandwiched between the probe electrode 1004 and transparent substrate 1002. Examples of sacrificial layers are silicon dioxide, silicon nitride, and/or silicon, among other compounds. According to an embodiment, the sacrificial layer 1102 is transparent or translucent and allows for optical or SEM imaging through the prober chip to the underlying sample or chip.

Figure 12:
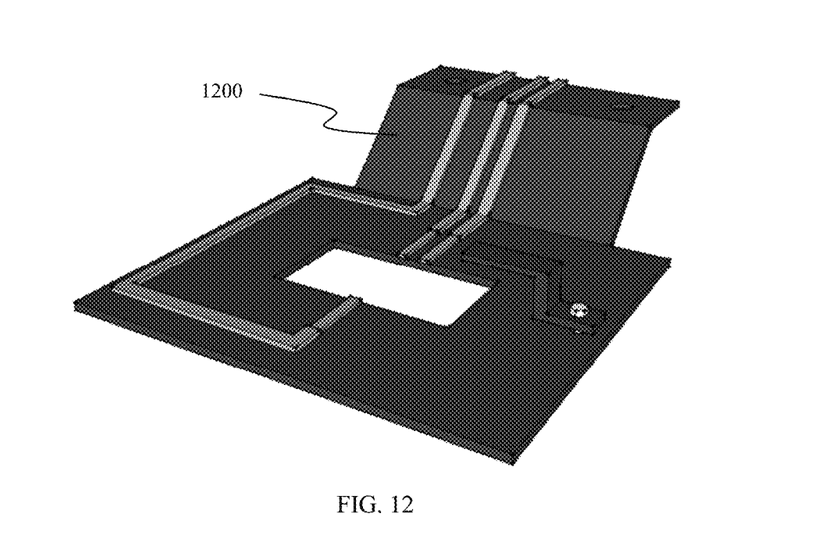
FIG. 12 is a schematic representation of a prober head, in accordance with an embodiment.
Figure 13:
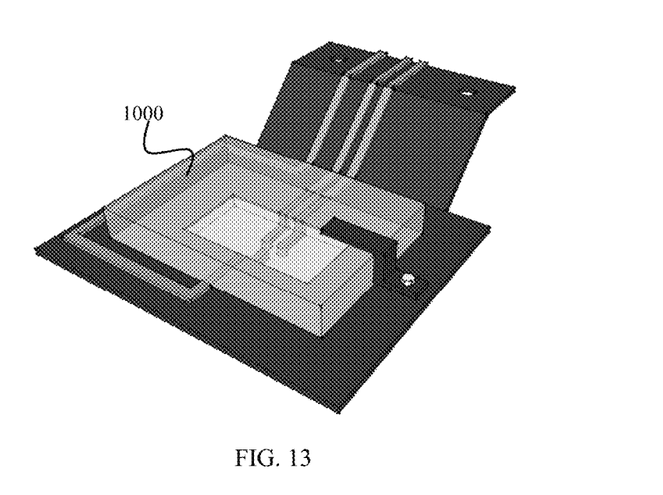
FIG. 13 is a schematic representation of the mounting of a prober chip into a prober head, in accordance with an embodiment.
Figure 14:
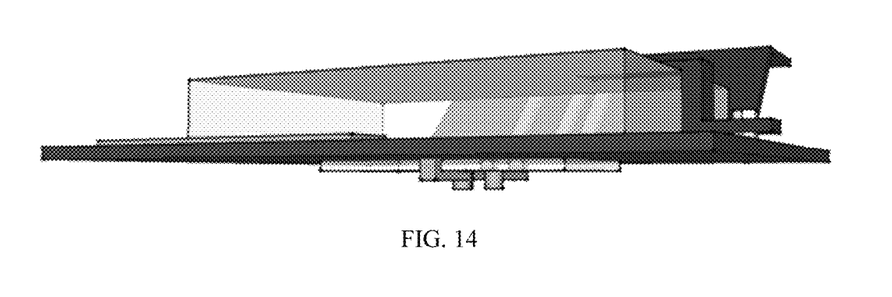
FIG. 14 is a schematic representation of a mounted prober chip, in accordance with an embodiment.

Referring to FIG. 12, in one embodiment, is a schematic representation of a prober head 1200 which houses a prober chip/transparent layer system, as shown for example in FIG. 13. According to an embodiment, the prober head 1200 can be mounted on a stack of nanopositioners and rotating stages for precision navigation of the prober chip to a target area. The prober chip is mounted in such a way that it sits in a recess part of the prober head. Thus, the probe tips can be horizontally aligned with respect to the sample surface such that only the probe tips are in contact with the sample during nanoprobing, as shown in FIG. 14 in accordance with an embodiment.

Functional Through-Hole Prober Chip

According to an embodiment, there can be limitation(s) on the use of a functional transparent prober chip 1000 in an SEM. For example, the electron beam in the SEM might not be able to penetrate the transparent substrate to allow for optical viewing and alignment of the probe tips to the underlying sample. Thus, to allow for optical viewing and alignment of a functional prober chip to an underlying sample in an SEM or optical microscope, a through-hole could be etched in the prober chip. The through-hole is then utilized to align the prober chip and the underlying sample.

Referring to FIGS. 15A through 15K, in accordance with an embodiment, is a method for fabricating a functional through-hole prober chip apparatus.

Figure 15A:
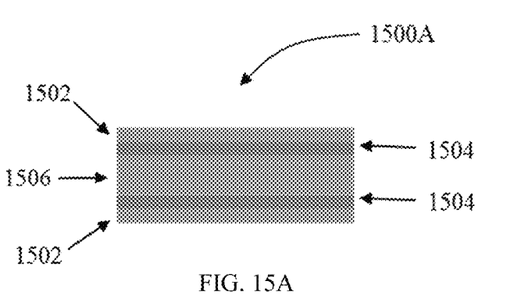
FIG. 15A is the first in a series of schematic diagrams illustrating the results of progressive process stages in fabricating a functional through-hole prober chip apparatus, in accordance with the embodiments
Figure 15B:
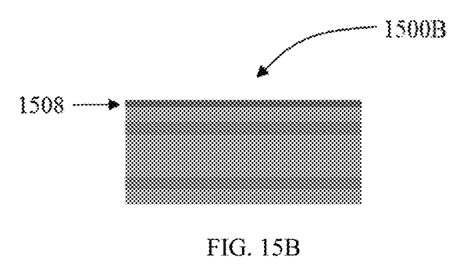
FIG. 15B is a schematic representation of a stage of fabrication of a through-hole prober chip apparatus, in accordance with an embodiment.
Figure 15C:
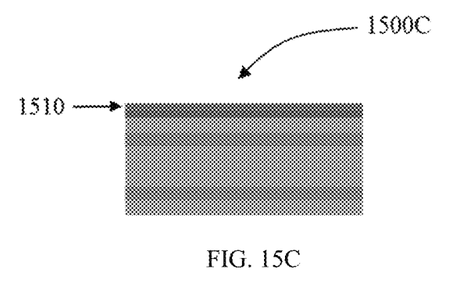
FIG. 15C is a schematic representation of a stage of fabrication of a through-hole prober chip apparatus, in accordance with an embodiment.

In FIG. 15A is shown a substrate 1506, an insulator layer 1504 and a device layer 1502. In FIG. 15B, a metal layer 1508 is deposited on the device layer 1502. In FIG. 15C, a photoresist 1510 is spun on the metal layer 1508.

Figure 15D:
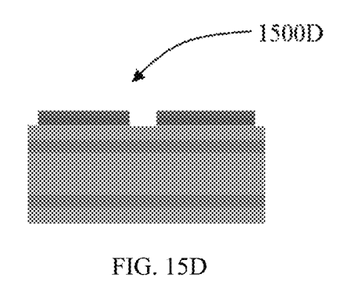
FIG. 15D is a schematic representation of a stage of fabrication of a through-hole prober chip apparatus, in accordance with an embodiment.
Figure 15E:
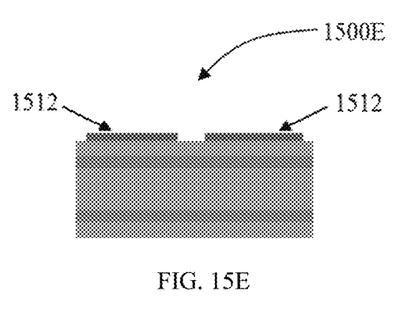
FIG. 15E is a schematic representation of a stage of fabrication of a through-hole prober chip apparatus, in accordance with an embodiment.
Figure 15F:
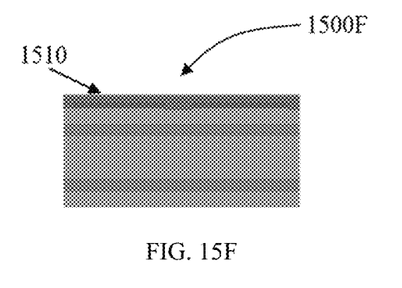
FIG. 15F is a schematic representation of a stage of fabrication of a through-hole prober chip apparatus, in accordance with an embodiment.
Figure 15G:
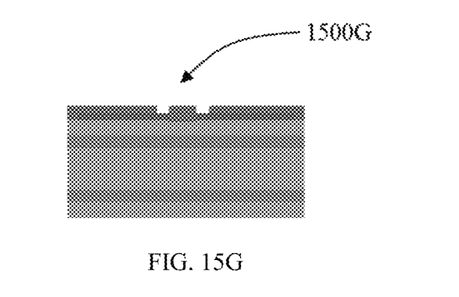
FIG. 15G is a schematic representation of a stage of fabrication of a through-hole prober chip apparatus, in accordance with an embodiment.
Figure 15H:
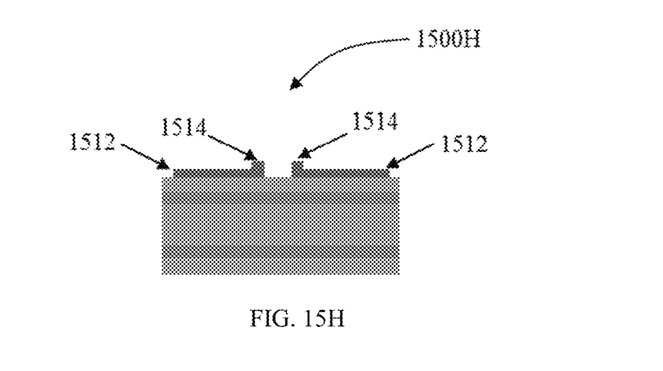
FIG. 15H is a schematic representation of a stage of fabrication of a through-hole prober chip apparatus, in accordance with an embodiment.

In FIG. 15D, standard lithography steps pattern the photoresist 1510 and etch the metal layer 1508. In FIG. 15E, the photoresist layer 1510 is removed and probe electrodes 1512 are formed. In FIG. 15F, photoresist 1510 is spun on the probe electrodes 1512. In FIG. 15G, standard lithography steps pattern the photoresist 1510 at the apex of the probe electrodes 1512. In FIG. 15H, a probe tip 1514 is formed via deposition of a conductive material such as a metal, alloy, paste, and/or a 2-dimensional material at the apex of the probe electrode 1512. The conductive material could also exhibit a cushion-like behavior by reversibly deforming when pushed against a sample.

Figure 15I:
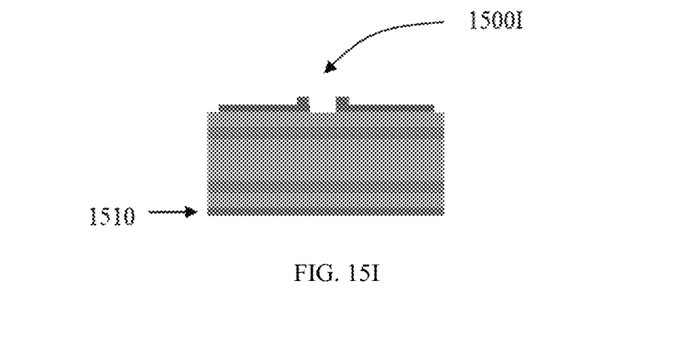
FIG. 15I is a schematic representation of a stage of fabrication of a through-hole prober chip apparatus, in accordance with an embodiment.
Figure 15J:
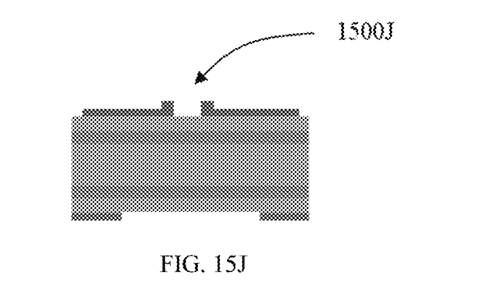
FIG. 15J is a schematic representation of a stage of fabrication of a through-hole prober chip apparatus, in accordance with an embodiment.
Figure 15K:
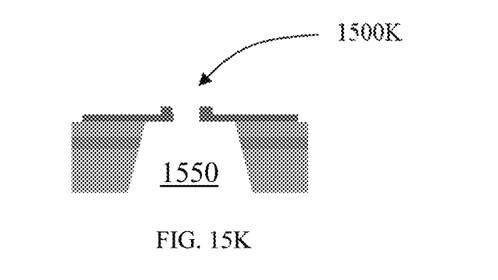
FIG. 15K is a schematic representation of a stage of fabrication of a through-hole prober chip apparatus, in accordance with an embodiment.

In FIG. 15I, photoresist 1510 is spun on the backside device layer 1502. In FIG. 15J, standard lithography steps pattern the photoresist 1510 at the backside device layer 1502. In FIG. 15K, a through-hole 1550 is etched in the device layers 1502, insulator layers 1504, and substrate 1506. According to an embodiment, the apex of the probes 1514 are detached from the device layer 1502 and freely suspended. The probe tips are thus at least partially spring-loaded.

Figure 16:
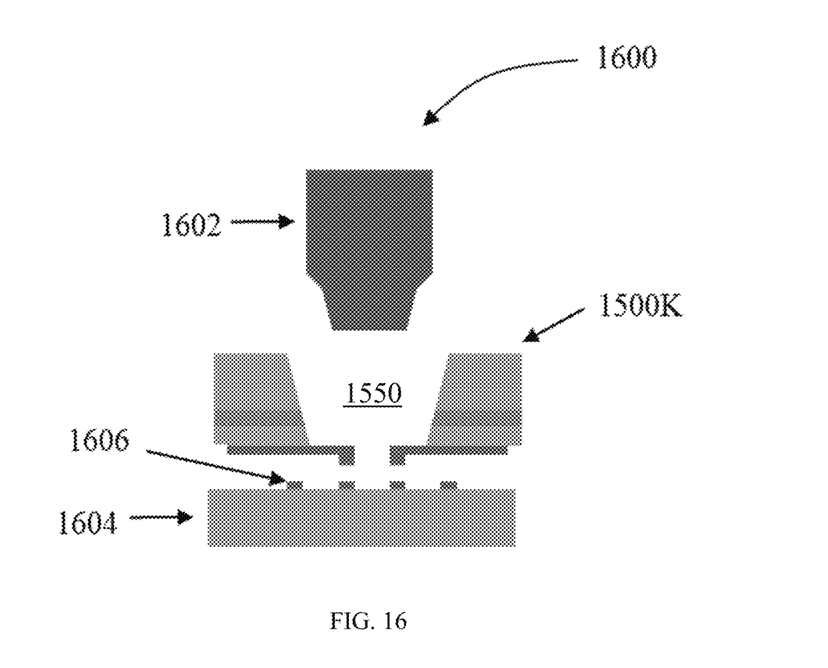
FIG. 16 is a schematic representation of an integration of a microscope on a through-hole prober chip, in accordance with an embodiment.

Referring to FIG. 16, in accordance with an embodiment, is a schematic representation of a system 1600 using a microscope 1602 to optically view the functional through-hole prober chip 1500K in conjunction with an underlying sample 1604 with test features 1606.

Figure 17:
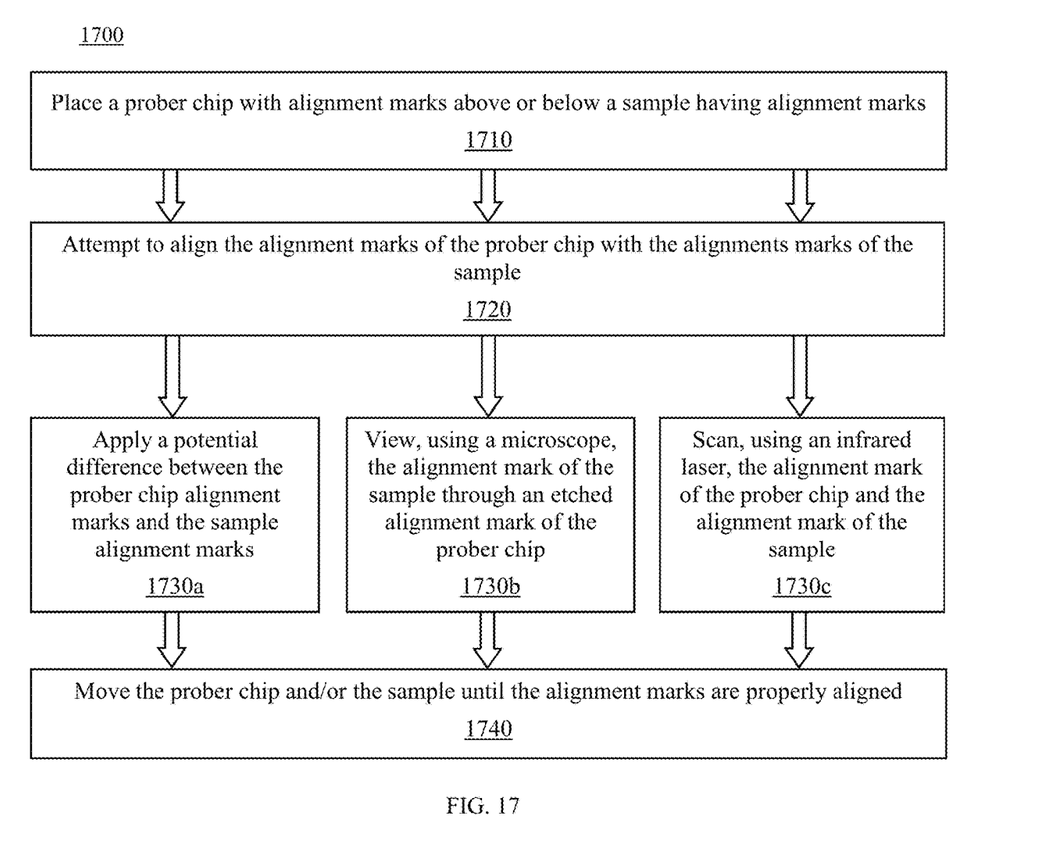
FIG. 17 is a flowchart of several methods for aligning a prober chip to a sample, in accordance with an embodiment.

Referring to FIG. 17, in one embodiment, is a flowchart of a method 1700 for aligning a prober chip and a sample. The prober chip can be any of the embodiments described or otherwise envisioned herein. At step 1710 of the method, the prober chip is placed above or below a sample. Both the prober chip and the sample comprise one or more alignment marks that facilitate alignment.

According to an embodiment, the alignment marks of the prober chip are conductive, and the alignment marks of the sample are conductive. At step 1720a of the method, the alignment marks of the prober chip are contacted—or attempted to be contacted—with the conductive alignment marks of the sample.

At step 1730a of the method, to test the alignment, a potential difference is applied between the alignment marks of the prober chip and the conductive alignment marks of the sample.

At step 1740a of the method, if the prober chip and the sample are not properly aligned, then the prober chip and/or the sample are moved—such as translating and rotating the prober chip and/or the sample—until current flows between the alignment mark of the prober chip and the alignment mark of the sample.

According to another embodiment, an alignment mark of the prober chip is etched. At step 1720 of the method, the alignment marks of the prober are attempted to be aligned with the conductive alignment marks of the sample.

At step 1730b of the method, to test the alignment, a microscope is utilized to view—or attempt to view—the alignment mark of the sample through the etched alignment mark of the prober chip.

At step 1740 of the method, if the prober chip and the sample are not properly aligned, then the prober chip and/or the sample are moved—such as translating and rotating the prober chip and/or the sample—until the etched alignment mark of the prober chip is aligned to the alignment mark of the sample.

According to another embodiment, the alignment marks of the prober chip and the sample each comprise a plurality of edges. At step 1720 of the method, the alignment marks of the prober are attempted to be aligned with the conductive alignment marks of the sample.

At step 1730c of the method, to test the alignment, an infrared laser scans the alignment mark of the prober chip and the alignment mark of the sample.

At step 1740 of the method, if the prober chip and the sample are not properly aligned, then the prober chip and/or the sample are moved—such as translating and rotating the prober chip and/or the sample—until the edges of the alignment mark of the prober chip are aligned with the edges of the alignment mark of the sample.

Image Recognition Alignment

According to an embodiment, if the layout of the probe tips is the same as the features on the sample, then with the help of an optical microscope or a scanning electron microscope, an image recognition algorithm can be implemented to navigate the nanopositioners until the position of the probe tips are matched to the location of features on the sample.

While various embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings is/are used. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, embodiments may be practiced otherwise than as specifically described and claimed. Embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present disclosure.

The above-described embodiments of the described subject matter can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single device or computer or distributed among multiple devices/computers.

What is claimed is:

1. A CMOS prober chip, the CMOS prober chip comprising:

a plurality of probe tips, wherein each of the plurality of probe tips are spring-loaded and each of the plurality of probe tips comprises an apex at an end of each respective probe tip, the apex comprising a conductive material, the conductive material arranged to reversibly deform when in contact with a sample;
a plurality of interlayer metals;
a plurality of interlayer dielectrics; and
a plurality of bonding pads;
wherein the plurality of interlayer metals are in conductive communication with the conductive material of the plurality of probe tips, and are further in conductive communication with the plurality of bonding pads and wherein the conductive material is deposited over the apex of each respective probe tip; wherein the conductive material and the plurality of probe tips are formed as portions of the same CMOS prober chip on a single substrate.

2. The CMOS prober chip of claim 1, wherein the conductive material comprises a thin film material selected from a group consisting of graphene and molybdenum disulphide.

3. The CMOS prober chip of claim 1, wherein the conductive material comprises a metal or metal-alloy.

4. The CMOS prober chip of claim 1, wherein each of the plurality of probe tips comprises a metal contact plug.

5. The CMOS prober chip of claim 4, wherein the metal contact plug comprises tungsten, platinum, gold, cobalt, nickel, an alloy, and/or silicide.

6. The CMOS prober chip of claim 1, wherein at least one of the plurality of probe tips is freely suspended along at least a portion of its length.

7. A method for manufacturing the CMOS prober chip of claim 1, the method comprising the step of selectively depositing the conductive material at an apex of each of the plurality of probe tips and wherein the step of selectively depositing a conductive material comprises electroplating, evaporation, sputtering, plasma enhanced chemical vapor deposition, and/or atomic layer deposition.

8. A prober chip, the prober chip comprising:
a plurality of spring-loaded probe tips, the plurality of probe tips each including an apex and each apex comprises a deposited conductive material, wherein the plurality of spring-loaded probe tips are configured to reversibly conform and the conductive material is arranged to reversibly deform when in contact with a sample;
a plurality of interlayer metals;
a plurality of interlayer dielectrics;
a plurality of through-substrate-vias;
a plurality of bonding pads; and
a substrate;
wherein the plurality of interlayer metals are in conductive communication with the plurality of probe tips, and are further in conductive communication with the plurality of bonding pads and wherein the deposited conductive material is deposited over the apex of each respective probe tip; wherein the conductive material and the plurality of probe tips are formed as portions of the same CMOS prober chip on a single substrate.

9. The prober chip of claim 8, wherein at least some of the plurality of probe tips are freely suspended along at least a portion of their length.

10. The prober chip of claim 8, wherein each of the plurality of through-substrate-vias is filled with a conductive material configured to conductively connect the bonding pads to the plurality of interlayer metals.

11. The prober chip of claim 8, wherein the substrate comprises silicon, silicon carbide, germanium, glass, pyrex, fused silica and/or quartz.

* * * * *